(12) United States Patent
Watanabe

(10) Patent No.: US 9,882,541 B2
(45) Date of Patent: Jan. 30, 2018

(54) ELECTRONIC COMPONENT

(71) Applicant: Murata Manufacturing Co., Ltd., Nagaokakyo-shi, Kyoto-fu (JP)

(72) Inventor: Kunihiro Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 90 days.

(21) Appl. No.: 15/008,769

(22) Filed: Jan. 28, 2016

(65) Prior Publication Data

US 2016/0226463 A1    Aug. 4, 2016

(30) Foreign Application Priority Data

Jan. 29, 2015  (JP) ................. 2015-015627

(51) Int. Cl.
  *H03H 7/09* (2006.01)
  *H03H 7/01* (2006.01)
  *H03H 1/00* (2006.01)

(52) U.S. Cl.
  CPC ............ *H03H 7/0115* (2013.01); *H03H 7/09* (2013.01); *H03H 7/1758* (2013.01); *H03H 7/1766* (2013.01); *H03H 7/1775* (2013.01); *H03H 2001/0085* (2013.01)

(58) Field of Classification Search
  CPC ......... H03H 2001/0085; H03H 7/0115; H03H 7/09; H03H 7/1758; H03H 7/1775; H03H 7/1766
  USPC .................................................. 333/175, 185
  See application file for complete search history.

(56) References Cited

U.S. PATENT DOCUMENTS

| | | | |
|---|---|---|---|
| 2002/0030561 A1* | 3/2002 | Masuda ................... | H03H 3/00 333/177 |
| 2013/0076454 A1 | 3/2013 | Imamura | |
| 2014/0253404 A1 | 9/2014 | Ikemoto et al. | |
| 2015/0061791 A1* | 3/2015 | Imamura .................. | H03H 7/09 333/185 |

(Continued)

FOREIGN PATENT DOCUMENTS

| | | |
|---|---|---|
| EP | 2 009 787 A1 | 12/2008 |
| JP | 2009-218756 A | 9/2009 |

(Continued)

OTHER PUBLICATIONS

Official Communication issued in corresponding Japanese Patent Application No. 2015-015627, dated Jan. 24, 2017.

*Primary Examiner* — Rakesh Patel
(74) *Attorney, Agent, or Firm* — Keating & Bennett, LLP

(57) ABSTRACT

An electronic component includes first through n-th inductors that turn around as viewed from a first direction perpendicular or substantially perpendicular to a stacking direction of a multilayer body of the electronic component. An (n+1)-th inductor includes a linear (n+1)-th inductor conductive layer which is provided in a configuration in which it turns around, as viewed from the stacking direction, and which is located within a region surrounded by the first inductor, as viewed from the first direction. An (n+1)-th capacitor is electrically connected to a first outer electrode, and includes an (n+1)-th capacitor conductive layer which opposes a first inductor conductive layer defining the first inductor with an insulating layer of a plurality of insulating layers of the multilayer body interposed therebetween.

12 Claims, 12 Drawing Sheets

(56) References Cited

U.S. PATENT DOCUMENTS

2015/0318593 A1\* 11/2015 Imamura .............. H03H 7/0115
333/175

FOREIGN PATENT DOCUMENTS

| JP | 2013-070288 A | 4/2013 |
| WO | 2007/119356 A1 | 10/2007 |
| WO | 2013/115158 A1 | 8/2013 |

\* cited by examiner

10a

10d

ELECTRONIC COMPONENT

BACKGROUND OF THE INVENTION

1. Field of the Invention

The present invention relates to an electronic component, and more particularly, to an electronic component including a plurality of resonators.

2. Description of the Related Art

As electronic components of the related art, a band pass filter disclosed in Japanese Unexamined Patent Application Publication No. 2013-70288, for example, is known. This band pass filter includes an input terminal, an output terminal, four LC parallel resonators, and first and second trap resonators. The four LC parallel resonators are magnetically coupled with each other so as to define a band pass filter. The first trap resonator includes a capacitor and an inductor connected in parallel with each other, and is disposed between the input terminal and an LC parallel resonator. The second trap resonator includes a capacitor and an inductor connected in parallel with each other, and is disposed between the output terminal and an LC parallel resonator. In the electronic component configured as described above, by the provision of the trap resonators, it is possible to increase the attenuation of a radio-frequency signal at the cutoff frequency side of the high frequency side of a pass band.

However, in the band pass filter disclosed in the above publication, it is difficult to decrease the size of the LC parallel resonators. This will be discussed more specifically. The inductors of the four LC parallel resonators and the first and second trap resonators each include a line electrode layer and two via-electrodes. The line electrode layer is a linear line electrode layer extending in a first direction perpendicular or substantially perpendicular to a top-bottom direction. The two via-electrodes extend from both ends of the line electrode layer downward. With this configuration, the six inductors each have a substantially angular U-shape opened downward, and are aligned in a second direction perpendicular or substantially perpendicular to the first direction. In this manner, if many inductors are aligned in the second direction, the length of the electronic component in the second direction is increased.

SUMMARY OF THE INVENTION

Accordingly, preferred embodiments of the present invention provide an electronic component which is significantly reduced in size.

According to preferred embodiments of the present invention, an electronic component includes the following elements. A multilayer body includes a plurality of insulating layers stacked on each other in a stacking direction. A first outer electrode is disposed on a surface of the multilayer body. First through n-th (n is an integer of two or greater) resonators are arranged in the multilayer body in a first direction perpendicular or substantially perpendicular to the stacking direction in order of the first through n-th resonators. Among the first through n-th resonators, resonators adjacent to each other in the first direction are magnetically coupled with each other. A first LC parallel resonator is connected to the first outer electrode. The first through n-th resonators respectively include first through n-th inductors and first through n-th capacitors. The first through n-th inductors respectively include first through n-th inductor conductive layers disposed on an insulating layer of the plurality of insulating layers and first through n-th interlayer connecting conductors passing through an insulating layer of the plurality of insulating layers in the stacking direction. The first through n-th inductor conductive layers and the first through n-th interlayer connecting conductors are connected to each other so that the first through n-th inductors are provided in a configuration in which the first through n-th inductors turn around, as viewed from the first direction. The first LC parallel resonator includes an (n+1)-th inductor and an (n+1)-th capacitor. The (n+1)-th inductor includes a linear (n+1)-th inductor conductive layer which is provided in a configuration in which the linear (n+1)-th inductor conductive layer turns around, as viewed from the stacking direction, and which is located within a region surrounded by the first inductor, as viewed from the first direction. The (n+1)-th inductor is connected to the first resonator. The (n+1)-th capacitor is electrically connected to the first outer electrode, and includes an (n+1)-th capacitor conductive layer which opposes the first inductor conductive layer with an insulating layer of the plurality of insulating layers interposed therebetween.

According to preferred embodiments of the present invention, it is possible to significantly reduce the size of an electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the invention will be described below with reference to the accompanying drawings.

First Preferred Embodiment

Figure 1A:
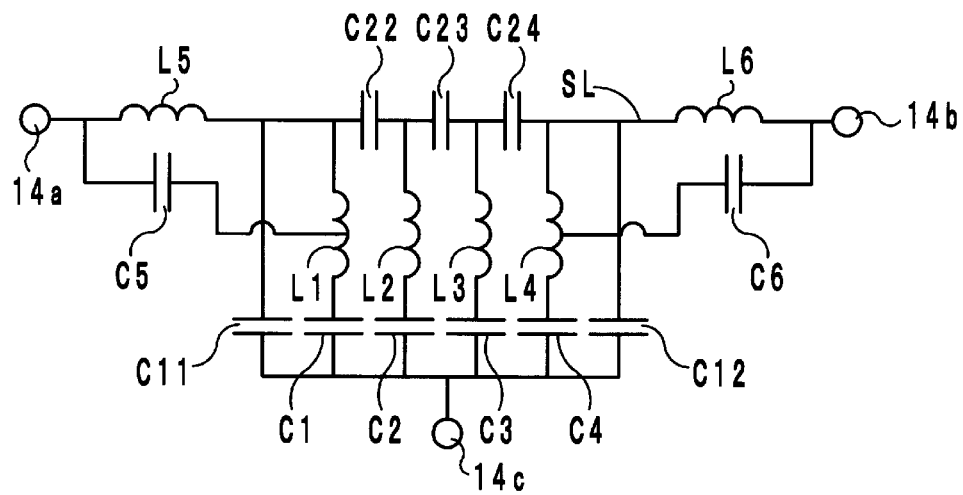
FIG. 1A is an equivalent circuit diagram of an electronic component according to a first preferred embodiment of the present invention.

An example of the circuit configuration of an electronic component 10a according to a first preferred embodiment of the present invention will first be discussed below with reference to the equivalent circuit diagram of FIG. 1A.

The electronic component 10a preferably is a band pass filter including a combination of low pass filters and high pass filters. As shown in FIG. 1A, the electronic component 10a includes outer electrodes 14a through 14c, inductors L1 through L6, and capacitors C1 through C6, C11, C12, and C22 through C24.

The outer electrodes 14a and 14b are input/output terminals into and from which a radio-frequency signal is input and output. The outer electrode 14c is a ground terminal to be connected to a ground potential. The outer electrodes 14a and 14b are connected to each other by a signal path SL.

The inductor L5, the capacitors C22 through C24, and the inductor L6 are disposed on the signal path SL, and are electrically connected in series with each other in this order from the outer electrode 14a to the outer electrode 14b.

The capacitor C11 is connected between a node between the inductor L5 and the capacitor C22 and the outer electrode 14c. With this configuration, the inductor L5 and the capacitor C11 define a low pass filter LPF1. The cutoff frequency of the low pass filter LPF1 is a frequency fc1.

The capacitor C12 is connected between a node between the inductor L6 and the capacitor C24 and the outer electrode 14c. With this configuration, the inductor L6 and the capacitor C12 define a low pass filter LPF2. The cutoff frequency of the low pass filter LPF2 is a frequency fc2.

The inductor L1 and the capacitor C1 are electrically connected in series with each other between the signal path SL and the outer electrode 14c so as to define an LC series resonator LC1. In the first preferred embodiment, the LC series resonator LC1 is connected between a node between the inductor L5 and the capacitor C22 and the outer electrode 14c. The resonant frequency of the LC series resonator LC1 is a frequency fa1.

The inductor L2 and the capacitor C2 are electrically connected in series with each other between the signal path SL and the outer electrode 14c so as to define an LC series resonator LC2. In the first preferred embodiment, the LC series resonator LC2 is connected between a node between the capacitors C22 and C23 and the outer electrode 14c. The resonant frequency of the LC series resonator LC2 is a frequency fa2.

The inductor L3 and the capacitor C3 are electrically connected in series with each other between the signal path SL and the outer electrode 14c so as to define an LC series resonator LC3. In the first preferred embodiment, the LC series resonator LC3 is connected between a node between the capacitors C23 and C24 and the outer electrode 14c. The resonant frequency of the LC series resonator LC3 is a frequency fa3.

The inductor L4 and the capacitor C4 are electrically connected in series with each other between the signal path SL and the outer electrode 14c so as to define an LC series resonator LC4. In the first preferred embodiment, the LC series resonator LC4 is connected between a node between the capacitor C24 and the inductor L6 and the outer electrode 14c. The resonant frequency of the LC series resonator LC4 is a frequency fa4.

The capacitor C5 is electrically connected in parallel with a portion of the inductors L1 and L5 so as to define an LC parallel resonator LC5. In the first preferred embodiment, the capacitor C5 is connected between the outer electrode 14a and the inductor L1. A portion of the inductor L1 to which one end of the capacitor C5 is connected is a portion other than both ends of the inductor L1. Accordingly, this portion of the inductor L1 defines and functions as a capacitor electrode. The LC parallel resonator LC5 is connected to the outer electrode 14a. The resonant frequency of the LC parallel resonator LC5 is a frequency fa5.

The capacitor C6 is electrically connected in parallel with a portion of the inductors L4 and L6 so as to define an LC parallel resonator LC6. In the first preferred embodiment, the capacitor C6 is connected between the outer electrode 14b and the inductor L4. A portion of the inductor L4 to which one end of the capacitor C6 is connected is a portion other than both ends of the inductor L4. Accordingly, this portion of the inductor L4 defines and functions as a capacitor electrode. The LC parallel resonator LC6 is connected to the outer electrode 14b. The resonant frequency of the LC parallel resonator LC6 is a frequency fa6.

The electronic component 10a is designed so that the frequencies fc1 and fc2 will be higher than the frequencies fa1 through fa4. With this arrangement, the LC series resonators LC1 through LC4 and the low pass filters LPF1 and LPF2 define a band pass filter that allows a radio-frequency signal in a band between the frequencies fc1 and fc2 and the frequencies fa1 through fa4 to pass through the band pass filter and transmits the radio-frequency signal from the outer electrode 14a to the outer electrode 14b.

The electronic component 10a is also designed so that the frequencies fa5 and fa6 are set to coincide or substantially coincide with the cutoff frequency on the high frequency side of the pass band of the band pass filter. With this arrangement, the falling edge at the cutoff frequency on the high frequency side of the pass band of the band pass filter becomes sharp.

The inductor L1 and the capacitor C22 define a high pass filter HPF1. The cutoff frequency of the high pass filter HPF1 is fc11. As a result, the high pass filter HPF1 allows a radio-frequency signal in a band higher than the cutoff frequency fc11 to pass through the signal path SL.

The inductor L2 and the capacitors C22 and C23 define a high pass filter HPF2. The cutoff frequency of the high pass filter HPF2 is fc12. As a result, the high pass filter HPF2 allows a radio-frequency signal in a band higher than the cutoff frequency fc12 to pass through the signal path SL.

The inductor L3 and the capacitors C23 and C24 define a high pass filter HPF3. The cutoff frequency of the high pass filter HPF3 is fc13. As a result, the high pass filter HPF3 allows a radio-frequency signal in a band higher than the cutoff frequency fc13 to pass through the signal path SL.

The inductor L4 and the capacitor C24 define a high pass filter HPF4. The cutoff frequency of the high pass filter HPF4 is fc14. As a result, the high pass filter HPF4 allows a radio-frequency signal in a band higher than the cutoff frequency fc14 to pass through the signal path SL.

Figure 1B:
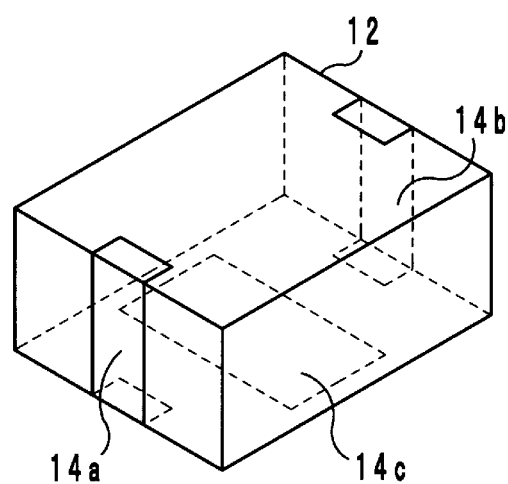
FIG. 1B is an external perspective view of the electronic component according to the first preferred embodiment of the present invention.
Figure 1B:
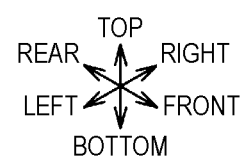
Figure 2:
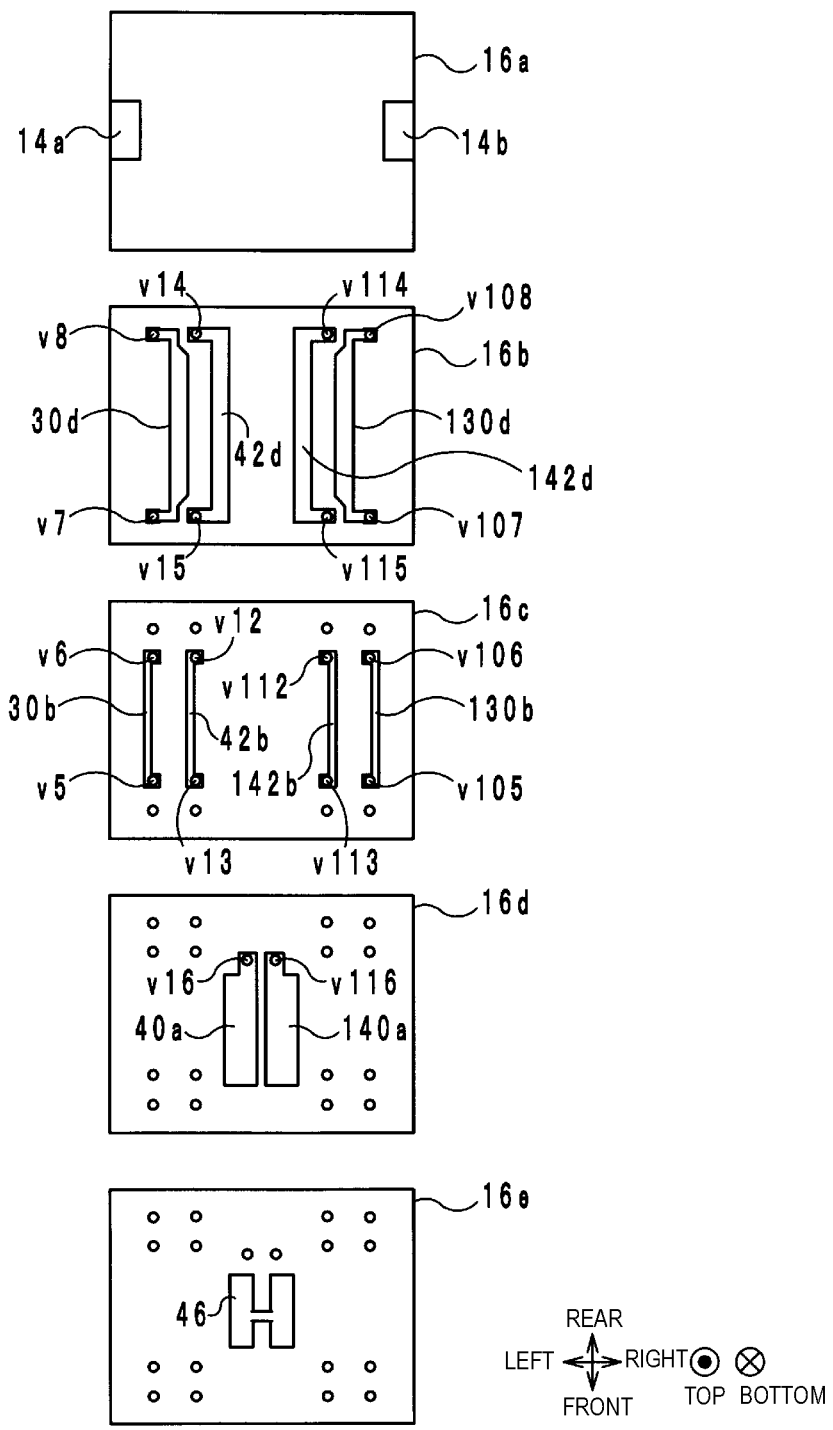
FIGS. 2 through 5 are exploded views of the electronic component according to the first preferred embodiment of the present invention.
Figure 3:
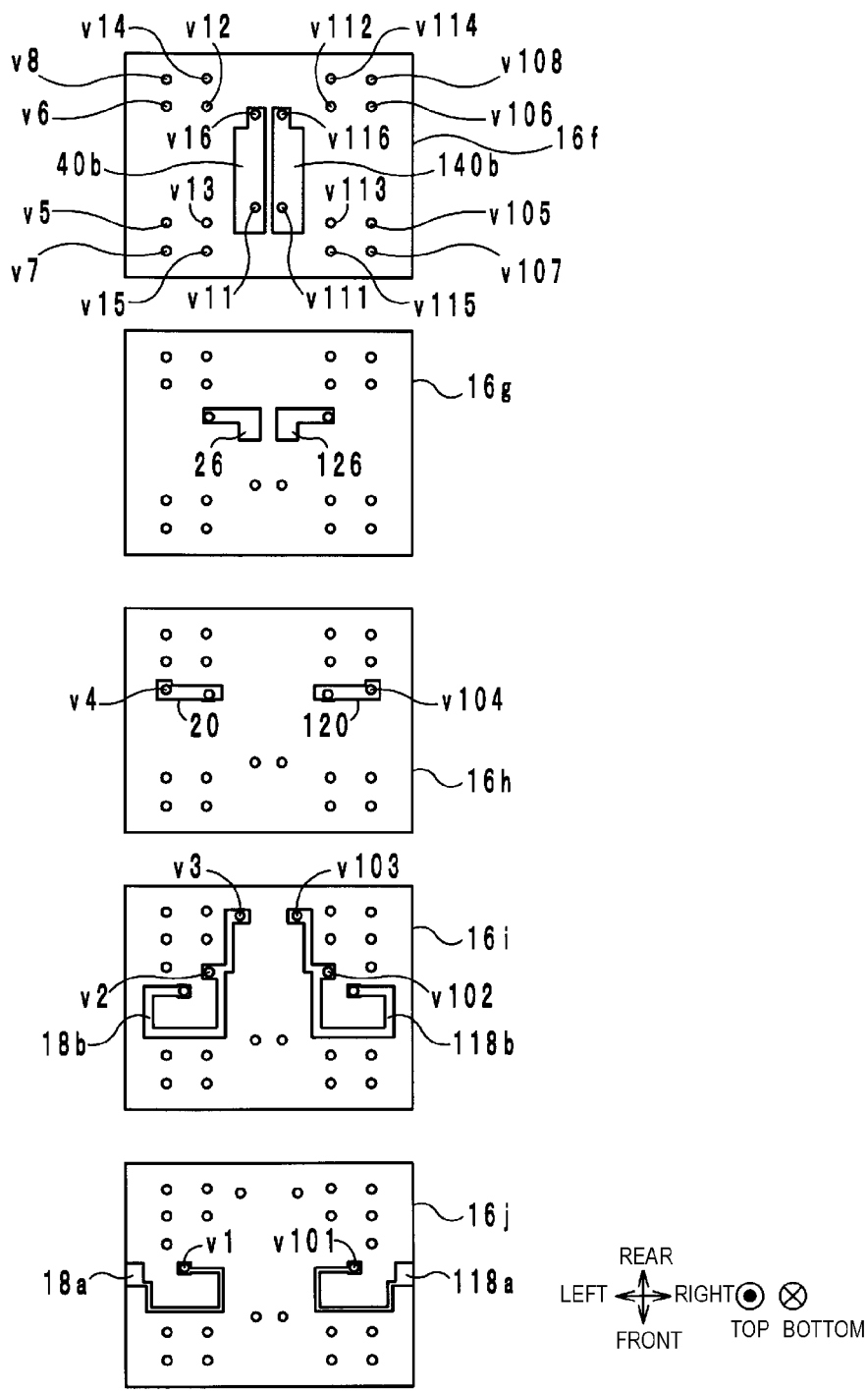
Figure 4:
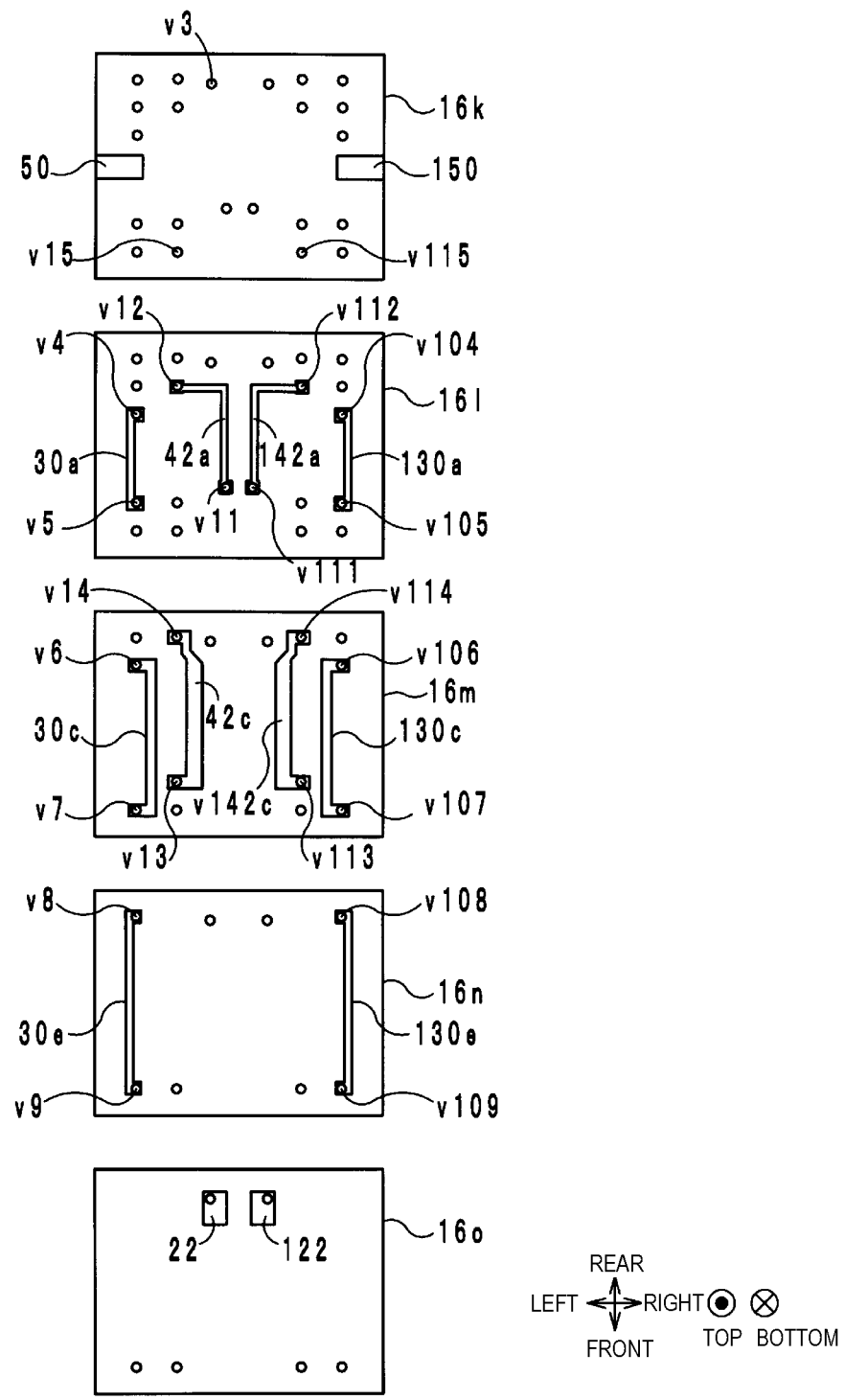
Figure 5:
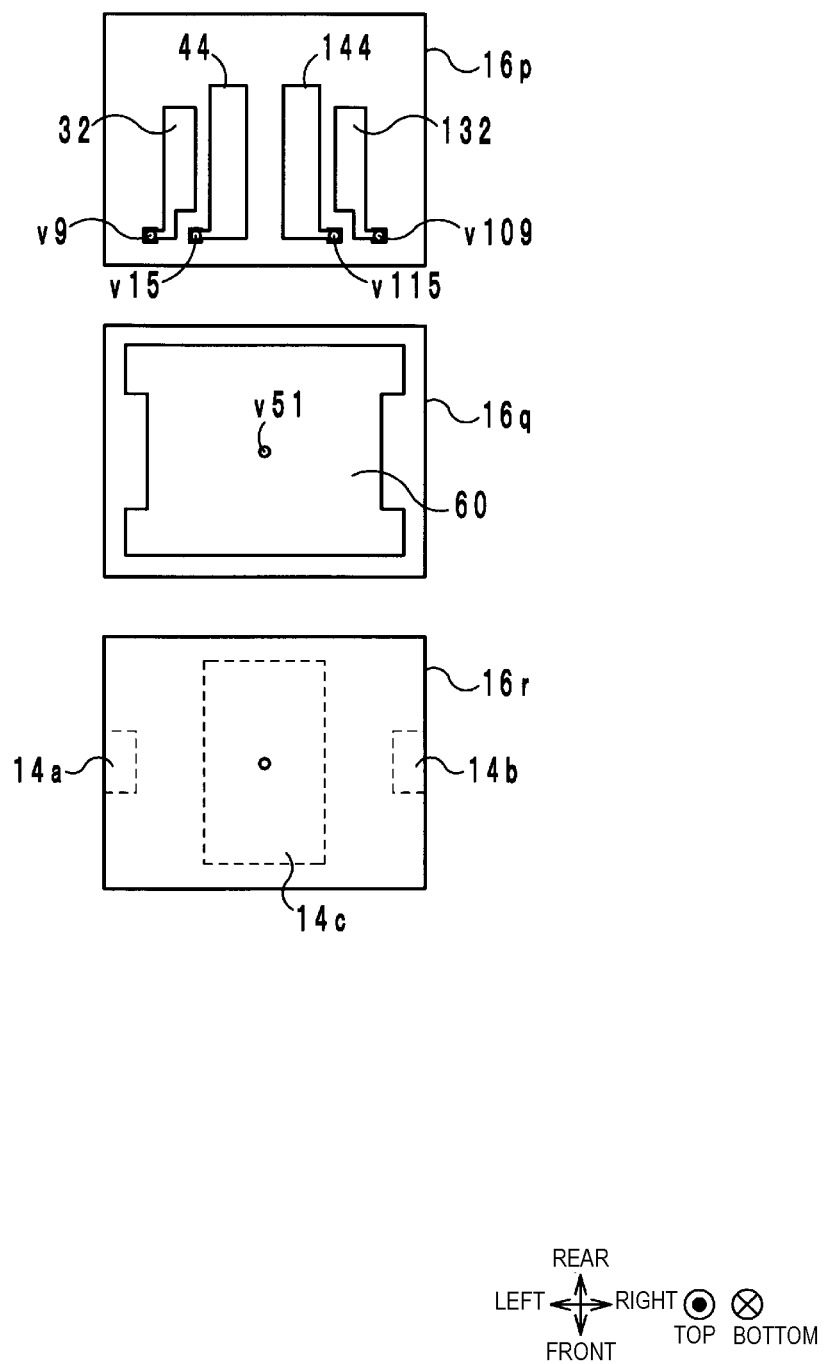

An example of the specific configuration of the electronic component 10a will now be described below with reference to the drawings. FIG. 1B is an external perspective view of the electronic component 10a. FIGS. 2 through 5 are exploded views of the electronic component 10a. The stacking direction of a multilayer body 12 of the electronic component 10a is defined as a top-bottom direction. The longitudinal direction of the top surface of the electronic component 10a, as viewed from above, is defined as a right-left direction, and the widthwise direction of the top surface of the electronic component 10a, as viewed from above, is defined as a front-rear direction.

As shown in FIGS. 1B through 5, the electronic component 10a includes a multilayer body 12, outer electrodes 14a through 14c, inductor conductive layers 18a, 18b, 30a through 30e, 42a through 42d, 118a, 118b, 130a through 130e, and 142a through 142d, connecting conductive layers 20 and 120, capacitor conductive layers 22, 26, 32, 40a, 40b, 44, 46, 50, 60, 122, 126, 132, 140a, 140b, 144, and 150, and via-hole conductors (an example of an interlayer connecting conductor) v1 through v9, v11 through v16, v51, v101 through v109, and viii through v116.

The multilayer body 12 preferably has a rectangular or substantially rectangular parallelepiped shape, and includes insulating layers 16a through 16r stacked on each other in this order from the top side to the bottom side. The insulating layers 16a through 16r preferably have a rectangular or substantially rectangular shape extending in the right-left direction, as viewed from above, and are made of, for example, ceramic. Hereinafter, the upper surfaces of the insulating layers 16a through 16r will be referred to as "top surfaces", and the lower surfaces thereof will be referred to as "bottom surfaces".

As shown in FIG. 1B, the outer electrodes 14a and 14b are respectively disposed on the left and right surfaces of the multilayer body 12 (that is, the surfaces of the multilayer body 12), and preferably have a strip-shaped structure extending in the top-bottom direction. The top and bottom end portions of the outer electrodes 14a and 14b are respectively bent to the top and bottom surfaces of the multilayer body 12.

As shown in FIG. 1B, the outer electrode 14c is located at or substantially at a center of the bottom surface of the multilayer body 12, and preferably has a rectangular or substantially rectangular shape. The outer electrodes 14a through 14c include Ni- and Sn-plating on base electrodes made of, for example, silver.

The inductor conductive layer 18a is a linear conductive layer disposed on the top surface of the insulating layer 16j. The inductor conductive layer 18a extends from the center of the left side of the insulating layer 16j as a start point to the center of the left half region of the insulating layer 16j as an end point. The inductor conductive layer 18a turns from the start point to the end point counterclockwise, as viewed from above. The inductor conductive layer 18a is connected to the outer electrode 14a.

The inductor conductive layer 18b is a linear conductive layer disposed on the top surface of the insulating layer 16i. The inductor conductive layer 18b extends from the center of the left half region of the insulating layer 16i as a start point to a point near the center of the rear side of the insulating layer 16i as an end point. The inductor conductive layer 18b turns from the start point to the end point counterclockwise, as viewed from above.

The via-hole conductor v1 passes through the insulating layer 16i in the top-bottom direction, and connects the end point of the inductor conductive layer 18a and the start point of the inductor conductive layer 18b. With this configuration, the inductor conductive layers 18a and 18b and the via-hole conductor v1 define the inductor L5 to have a helical or substantially helical shape.

The capacitor conductive layer 22 is a rectangular or substantially rectangular conductive layer disposed on the top surface of the insulating layer 16o. The capacitor conductive layer 22 is disposed near the center of the rear side of the insulating layer 16o.

The capacitor conductive layer 60 is a rectangular or substantially rectangular conductive layer disposed on the top surface of the insulating layer 16q. The capacitor conductive layer 60 covers the substantially entire surface of the insulating layer 16q and is thus superposed on the capacitor conductive layer 22, as viewed from above. With this configuration, the capacitor conductive layers 22 and 60 define the capacitor C11.

The via-hole conductor v3 passes through the insulating layers 16i through 16n in the top-bottom direction, and connects the end point of the inductor conductive layer 18b and the capacitor conductive layer 22. With this configuration, the capacitor C11 and the inductor L5 are connected to each other.

The via-hole conductor v51 passes through the insulating layers 16q and 16r in the top-bottom direction, and connects the capacitor conductive layer 60 and the outer electrode 14c. With this configuration, the capacitor C11 and the outer electrode 14c are connected to each other.

The inductor conductive layer 30a is a linear conductive layer disposed on the top surface of the insulating layer 16l and extending in the front-rear direction near the left side of the insulating layer 16l. The front and rear ends of the inductor conductive layer 30a are bent toward the right side.

The via-hole conductor v4 passes through the insulating layers 16h through 16k in the top-bottom direction. The bottom end of the via-hole conductor v4 is connected to the rear end of the inductor conductive layer 30a.

The inductor conductive layer 30b is a linear conductive layer disposed on the top surface of the insulating layer 16c and extending in the front-rear direction near the left side of the insulating layer 16c. The front and rear ends of the inductor conductive layer 30b are bent toward the right side. The front end of the inductor conductive layer 30b is superposed on the front end of the inductor conductive layer 30a, as viewed from above. The rear end of the inductor conductive layer 30b is located farther rearward than the rear end of the inductor conductive layer 30a, as viewed from above.

The via-hole conductor v5 passes through the insulating layers 16c through 16k in the top-bottom direction, and connects the front end of the inductor conductive layer 30a and the front end of the inductor conductive layer 30b.

The inductor conductive layer 30c is a linear conductive layer disposed on the top surface of the insulating layer 16m and extending in the front-rear direction near the left side of the insulating layer 16m. The front and rear ends of the inductor conductive layer 30c are bent toward the left side. The rear end of the inductor conductive layer 30c is superposed on the rear end of the inductor conductive layer 30b, as viewed from above. The front end of the inductor conductive layer 30c is positioned farther frontward than the front end of the inductor conductive layer 30b, as viewed from above.

The via-hole conductor v6 passes through the insulating layers 16c through 16l in the top-bottom direction, and connects the rear end of the inductor conductive layer 30b and the rear end of the inductor conductive layer 30c.

The inductor conductive layer 30d is a linear conductive layer disposed on the top surface of the insulating layer 16b and extending in the front-rear direction near the left side of the insulating layer 16b. The front and rear ends of the inductor conductive layer 30d are bent toward the left side. The front end of the inductor conductive layer 30d is superposed on the front end of the inductor conductive layer 30c, as viewed from above. The rear end of the inductor conductive layer 30d is located farther rearward than the rear end of the inductor conductive layer 30c, as viewed from above.

The via-hole conductor v7 passes through the insulating layers 16b through 16l in the top-bottom direction, and connects the front end of the inductor conductive layer 30c and the front end of the inductor conductive layer 30d.

The inductor conductive layer 30e is a linear conductive layer disposed on the top surface of the insulating layer 16n and extending in the front-rear direction near the left side of the insulating layer 16n. The front and rear ends of the inductor conductive layer 30e are bent toward the right side. The rear end of the inductor conductive layer 30e is superposed on the rear end of the inductor conductive layer 30d, as viewed from above. The front end of the inductor conductive layer 30e is superposed on the front end of the inductor conductive layer 30d, as viewed from above.

The via-hole conductor v8 passes through the insulating layers 16b through 16m in the top-bottom direction, and connects the rear end of the inductor conductive layer 30d and the rear end of the inductor conductive layer 30e.

The inductor conductive layers 30a through 30e and the via-hole conductors v4 through v8 are connected to each other in the above-described manner so as to define the inductor L1. With the above-described configuration, the inductor L1 preferably has a helical or substantially helical shape, as viewed from the left side (direction perpendicular or perpendicular or substantially perpendicular to the stacking direction). In the first preferred embodiment, the inductor L1 advances from inward to outward while turning around counterclockwise, as viewed from the left side.

In the inductor L1, among the inductor conductive layers 30a through 30e, inductor conductive layers adjacent to each other in the top-bottom direction are not superposed on each other. More specifically, the inductor conductive layer 30b preferably has a U-shape or substantially a U-shape opened rightward, while the inductor conductive layer 30d preferably has U-shape or substantially a U-shape opened leftward. Accordingly, the inductor conductive layers 30b and 30d are not superposed on each other, as viewed from above. The positional relationship between the inductor conductive layers 30a and 30c and that between the inductor conductive layers 30c and 30e are the same as that between the inductor conductive layers 30b and 30d, and an explanation thereof will thus be omitted.

The capacitor conductive layer 32 preferably is a rectangular or substantially rectangular conductive layer disposed on the top surface of the insulating layer 16p. The capacitor conductive layer 32 is disposed in the left half region of the insulating layer 16p. The capacitor conductive layer 32 is superposed on the capacitor conductive layer 60, as viewed from above. With this configuration, the capacitor conductive layers 32 and 60 define the capacitor C1.

The via-hole conductor v9 passes through the insulating layers 16n and 16o in the top-bottom direction. The top end of the via-hole conductor v9 is connected to the front end of the inductor conductive layer 30e, and the bottom end of the via-hole conductor v9 is connected to the capacitor conductive layer 32. With this configuration, the inductor L1 and the capacitor C1 are connected to each other. Since the capacitor conductive layer 60 is connected to the outer electrode 14c by using the via-hole conductor v51, the capacitor C1 is connected to the outer electrode 14c.

The connecting conductive layer 20 is a linear conductive layer disposed on the top surface of the insulating layer 16h and extending in the right-left direction in the left half region of the insulating layer 16h.

The via-hole conductor v2 passes through the insulating layers 16g and 16h in the top-bottom direction, and connects a point near the end point of the inductor conductive layer 18b and the right end of the connecting conductive layer 20. The top end of the via-hole conductor v4 is connected to the left end of the connecting conductive layer 20. With this configuration, the inductor L1 is connected to the inductor L5 via the connecting conductive layer 20 and the via-hole conductor v2.

The capacitor conductive layer 26 is an L-shaped or substantially L-shaped conductive layer disposed on the top surface of the insulating layer 16g and positioned on the left side of the center (intersection of diagonal lines) of the insulating layer 16g.

The capacitor conductive layer 40b preferably is a rectangular or substantially rectangular conductive layer disposed on the top surface of the insulating layer 16f and positioned on the left side of the center (intersection of diagonal lines) of the insulating layer 16f. The capacitor conductive layer 40b overlaps the capacitor conductive layer 26, as viewed from above. With this configuration, the capacitor conductive layers 26 and 40b define the capacitor C22.

The capacitor conductive layer 40a preferably is a rectangular or substantially rectangular conductive layer disposed on the top surface of the insulating layer 16d and positioned on the left side of the center (intersection of diagonal lines) of the insulating layer 16d. The capacitor conductive layer 40a is superposed on the capacitor conductive layer 40b such that they substantially coincide with each other, as viewed from above.

The via-hole conductor v16 passes through the insulating layers 16d and 16e in the top-bottom direction and connects the capacitor conductive layers 40a and 40b.

The inductor conductive layer 42a preferably is an L-shaped or substantially L-shaped linear conductive layer disposed on the top surface of the insulating layer 16l and positioned on the right side of the inductor conductive layer 30a. The inductor conductive layer 42a extends from a point near the center of the front side of the insulating layer 16l toward the rear side and is bent toward the left side.

The via-hole conductor v11 passes through the insulating layers 16f through 16k in the top-bottom direction. The top end of the via-hole conductor v11 is connected to the capacitor conductive layer 40b, and the bottom end of the via-hole conductor v11 is connected to the front end of the inductor conductive layer 42a.

The inductor conductive layer 42b is a linear conductive layer disposed on the top surface of the insulating layer 16c and extending in the front-rear direction on the right side of the inductor conductive layer 30b. The front and rear ends of the inductor conductive layer 42b are bent toward the right side. The rear end of the inductor conductive layer 42b is superposed on the rear end of the inductor conductive layer 42a, as viewed from above.

The via-hole conductor v12 passes through the insulating layers 16c through 16k in the top-bottom direction and connects the rear end of the inductor conductive layer 42a and the rear end of the inductor conductive layer 42b.

The inductor conductive layer 42c is a linear conductive layer disposed on the top surface of the insulating layer 16m and extending in the front-rear direction on the right side of the inductor conductive layer 30c. The front and rear ends of the inductor conductive layer 42c are bent toward the left side. The front end of the inductor conductive layer 42c is superposed on the front end of the inductor conductive layer 42b, as viewed from above, and the rear end of the inductor conductive layer 42c is positioned farther rearward than the rear end of the inductor conductive layer 42b, as viewed from above.

The via-hole conductor v13 passes through the insulating layers 16c through 16l in the top-bottom direction and connects the front end of the inductor conductive layer 42b and the front end of the inductor conductive layer 42c.

The inductor conductive layer 42d is a linear conductive layer disposed on the top surface of the insulating layer 16b and extending in the front-rear direction on the right side of the inductor conductive layer 30d. The front and rear ends of the inductor conductive layer 42d are bent toward the left side. The rear end of the inductor conductive layer 42d is superposed on the rear end of the inductor conductive layer 42c, as viewed from above, and the front end of the inductor conductive layer 42d is positioned farther frontward than the front end of the inductor conductive layer 42c, as viewed from above.

The via-hole conductor v14 passes through the insulating layers 16b through 16l in the top-bottom direction and connects the rear end of the inductor conductive layer 42c and the rear end of the inductor conductive layer 42d.

The via-hole conductor v15 passes through the insulating layers 16b through 16o in the top-bottom direction, and the top end of the via-hole conductor v15 is connected to the front end of the inductor conductive layer 42d.

The inductor conductive layers 42a through 42d and the via-hole conductors v11 through v15 are connected to each other in the above-described manner so as to define the inductor L2. With the above-described configuration, the inductor L2 preferably has a helical or substantially helical shape, as viewed from the left side (direction perpendicular or substantially perpendicular to the stacking direction). In the first preferred embodiment, the inductor L2 advances from inward to outward while turning around clockwise, as viewed from the left side. That is, the turning direction of the inductor L1 and that of the inductor L2 are opposite.

In the inductor L2, among the inductor conductive layers 42a through 42d, inductor conductive layers adjacent to each other in the top-bottom direction are not superposed on each other. The positional relationships among the inductor conductive layers 42a through 42d are similar to those of the inductor conductive layers 30a through 30e, and an explanation thereof will thus be omitted.

As discussed above, the top end of the via-hole conductor v11 is connected to the capacitor conductive layer 40b. Accordingly, the inductor L2 is connected to the capacitor C22.

The inductor conductive layers 18a and 18b are located within a region surrounded by the inductors L1 and L2, as viewed from the left side. In the first preferred embodiment, the inductor conductive layers 18a and 18b cross the vicinities of the centers of the inductors L1 and L2 preferably with a helical or substantially helical shape in the right-left direction. Accordingly, the inductor conductive layers 18a and 18b are surrounded by the inductor conductive layers 30b, 42b, 30c, and 42c, and the via-hole conductors v5, v6, v12, and v13.

The capacitor conductive layer 44 preferably is a rectangular or substantially rectangular conductive layer disposed on the top surface of the insulating layer 16p. The capacitor conductive layer 44 is disposed in the left half region of the insulating layer 16p. The capacitor conductive layer 44 is superposed on the capacitor conductive layer 60, as viewed from above. With this configuration, the capacitor conductive layers 44 and 60 define the capacitor C2.

The bottom end of the via-hole conductor v15 is connected to the capacitor conductive layer 44. Accordingly, the inductor L2 and the capacitor C2 are connected to each other. Since the capacitor conductive layer 60 is connected to the outer electrode 14c by using the via-hole conductor v51, the capacitor C2 is connected to the outer electrode 14c.

The capacitor conductive layer 50 preferably is a rectangular or substantially rectangular conductive layer disposed on the top surface of the insulating layer 16k and is connected to the outer electrode 14a. The capacitor conductive layer 50 overlaps the inductor conductive layer 30a, as viewed from above. With this configuration, the capacitor conductive layer 50 opposes the inductor conductive layer 30a with the insulating layer 16k interposed therebetween. As a result, the capacitor C5 is provided between the capacitor conductive layer 50 and the inductor conductive layer 30a.

The capacitor conductive layer 50 also opposes the inductor conductive layer 18a with the insulating layer 16j interposed therebetween.

The inductor conductive layers 118a, 118b, 130a through 130e, 142a through 142d, the connecting conductive layer 120, the capacitor conductive layers 122, 126, 132, 140a, 140b, 144, and 150, and the via-hole conductors v101 through v109 and viii through v116 are respectively symmetrical to the inductor conductive layers 18a, 18b, 30a through 30e, 42a through 42d, the connecting conductive layer 20, the capacitor conductive layers 22, 26, 32, 40a, 40b, 44, and 50, and the via-hole conductors v1 through v9 and v11 through v16 with respect to a straight line passing through the center of the top surface of the multilayer body 12 in the front-rear direction. Accordingly, an explanation of the inductor conductive layers 118a, 118b, 130a through 130e, 142a through 142d, the connecting conductive layer 120, the capacitor conductive layers 122, 126, 132, 140a, 140b, 144, and 150, and the via-hole conductors v101 through v109 and viii through v116 will be omitted.

The inductors L1 through L4 and the capacitors C1 through C4 are configured as described above. Accordingly, the LC series resonators LC1 through LC4 are arranged in this order from the left side to the right side. Among the LC series resonators LC1 through LC4, adjacent LC series resonators are magnetically coupled with each other.

The capacitor conductive layer 46 is disposed on the top surface of the insulating layer 16e, and includes two rectangular or substantially rectangular conductive layers and one linear conductive layer. One rectangular or substantially rectangular conductive layer overlaps the capacitor conductive layers 40a and 40b, as viewed from above. The other rectangular or substantially rectangular conductive layer overlaps the capacitor conductive layers 140a and 140b, as viewed from above. The linear conductive layer connects the two rectangular or substantially rectangular conductive layers. With this configuration, the capacitor conductive layers 40a, 40b, 46, 140a, and 140b define the capacitor C23.

The above-described inductor conductive layers, capacitor conductive layers, connecting conductive layers, and via-hole conductors include, for example, a conductive paste made of, for example, silver, as a main component.

It is possible to reduce the size of the electronic component 10a. This will be discussed more specifically. The inductor conductive layers 18a and 18b are located within a region surrounded by the inductors L1 and L2, as viewed from the left side. With this configuration, the inductor L5 does not have to be disposed on the left side of the inductor L1. This decreases the length of the electronic component 10a in the right-left direction, thus reducing the size of the electronic component 10a. Similarly, the inductor L6 does not have to be disposed on the right side of the inductor L4 for the reason similar to that given for the inductor L5.

The electronic component 10a also includes the LC parallel resonator LC5 connected to the outer electrode 14a. The frequency fa5 of the LC parallel resonator LC5 is set so that it will substantially coincide with the cutoff frequency on the high frequency side of the pass band of the band pass filter. With this arrangement, the falling edge at the cutoff frequency on the high frequency side of the pass band of the band pass filter becomes sharp.

Figure 6:
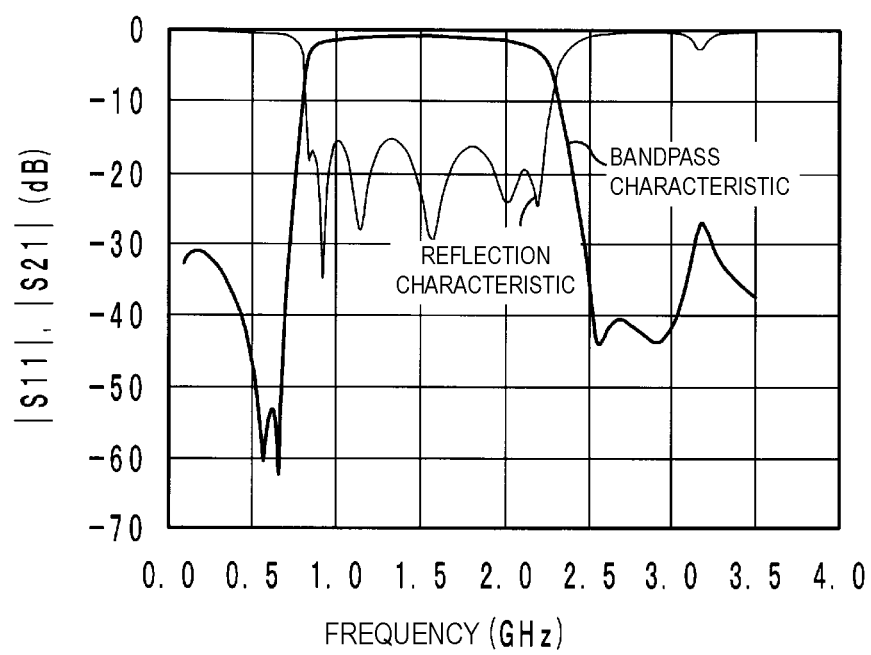
FIG. 6 is a graph illustrating simulation results of a first model.
Figure 7:
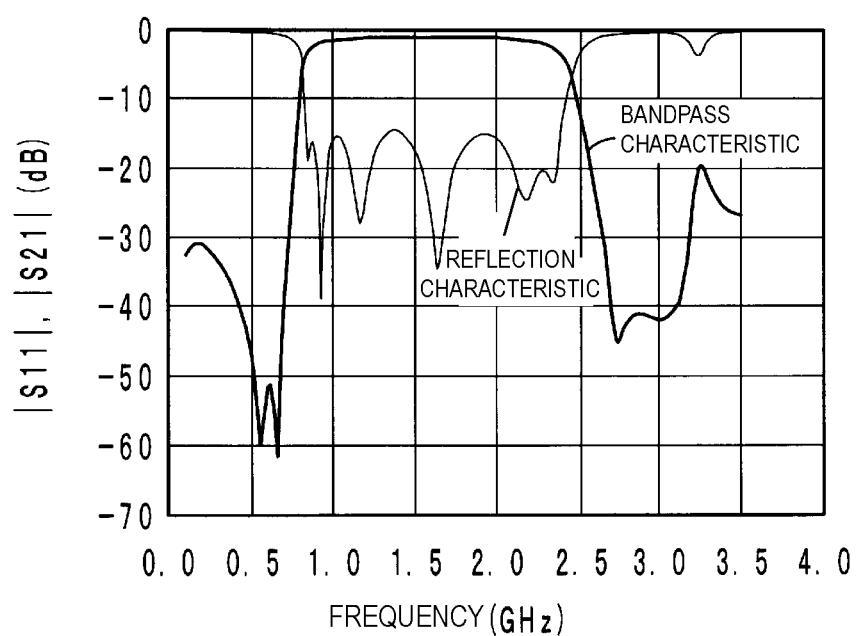
FIG. 7 is a graph illustrating simulation results of a second model.

For clarifying the advantages achieved by the electronic component 10a, the inventor of this application conducted the following computer simulations. A first model having the structure of the electronic component 10a was created. A second model was created by removing the capacitors C5 and C6 from the electronic component 10a. Then, the inventor calculated numeric values indicating the bandpass characteristics (S21) and the reflection characteristics (S11) of the first and second models by using a computer. FIG. 6 is a graph illustrating the simulation results of the first model. FIG. 7 is a graph illustrating the simulation results of the second model. In FIGS. 6 and 7, the vertical axis indicates |S11| and |S21|, while the horizontal axis indicates the frequency.

FIGS. 6 and 7 show that the falling edge of the bandpass characteristic of the first model at the cutoff frequency on the high frequency side of the pass band is sharper than that of the second model. The reason for this is that the LC parallel resonators LC5 and LC6 are provided in the electronic component 10a by adding the capacitors C5 and C6.

Additionally, in the electronic component 10a, the capacitor C5 can be added without increasing the complexity of the internal structure. For example, the capacitor C5 may be provided by adding a via-hole conductor connected to the inductor conductive layers 18a and 18b and by adding a capacitor conductive layer connected to this via-hole conductor. However, this increases the complexity of the routing of the via-hole conductor for forming the capacitor conductive layer. Then, in the electronic component 10a, the rectangular or substantially rectangular capacitor conductive layer 50 connected to the outer electrode 14a is added. Thus, the routing of a via-hole conductor is unnecessary and the internal structure is simplified.

Second Preferred Embodiment

Figure 8:
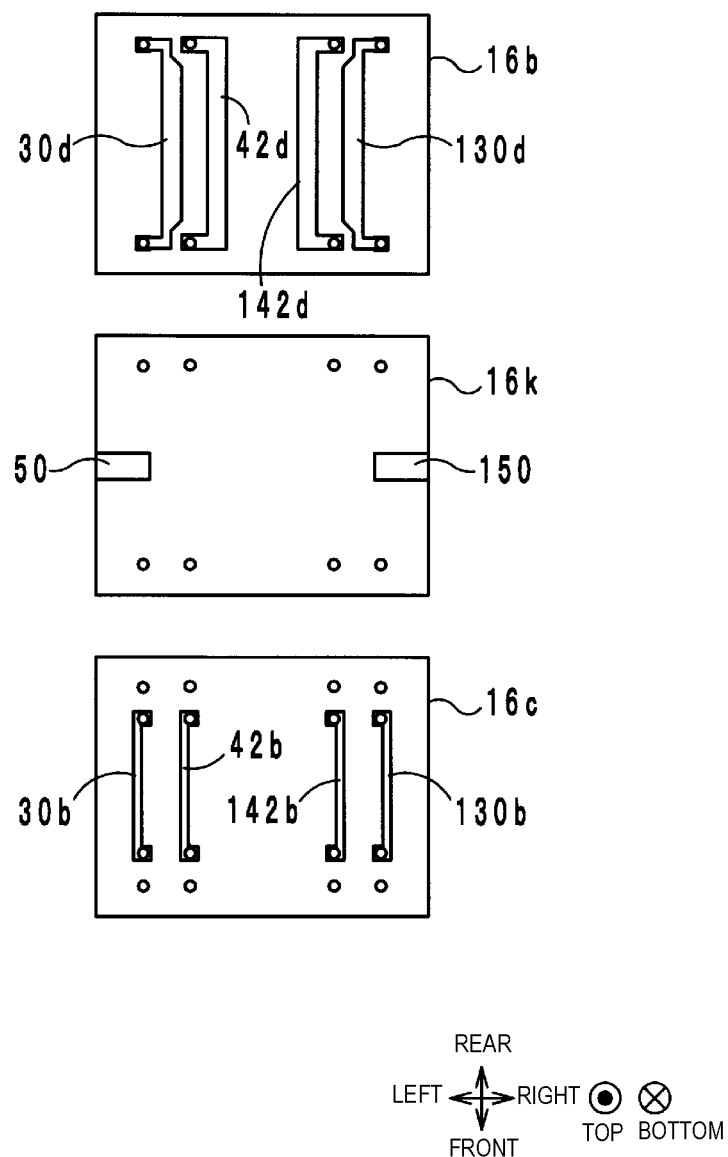
FIG. 8 shows plan views some insulating layers of an electronic component according to a second preferred embodiment of the present invention.

An electronic component 10b according to a second preferred embodiment of the present invention will be described below with reference to FIG. 8. FIG. 8 shows plan views of insulating layers 16b, 16k, and 16c of the electronic component 10b.

The electronic component 10b is different from the electronic component 10a in the position of the insulating layer 16k and the capacitor conductive layers 50 and 150. This will be discussed more specifically. The insulating layer 16k is disposed between the insulating layers 16b and 16c. The capacitor conductive layer 50 overlaps the inductor conductive layer 30b, as viewed from above. The inductor conductive layer 30b is disposed between the capacitor conductive layer 50 and the inductor conductive layers 18a and 18b. With this configuration, the capacitor conductive layer 50 does not oppose the inductor conductive layers 18a and 18b. The structure of the capacitor conductive layer 150 is similar to that of the capacitor conductive layer 50, and an explanation thereof will thus be omitted.

The electronic component 10b configured as described above achieves the same advantages as those of the electronic component 10a.

In the electronic component 10b, it is less likely that a capacitance will be generated between the capacitor conductive layer 50 and the inductor conductive layers 18a and 18b. It is thus possible to decrease the possibility that the resonant frequency fa5 of the LC parallel resonator LC5 will deviate from a desired value.

Third Preferred Embodiment

Figure 9:
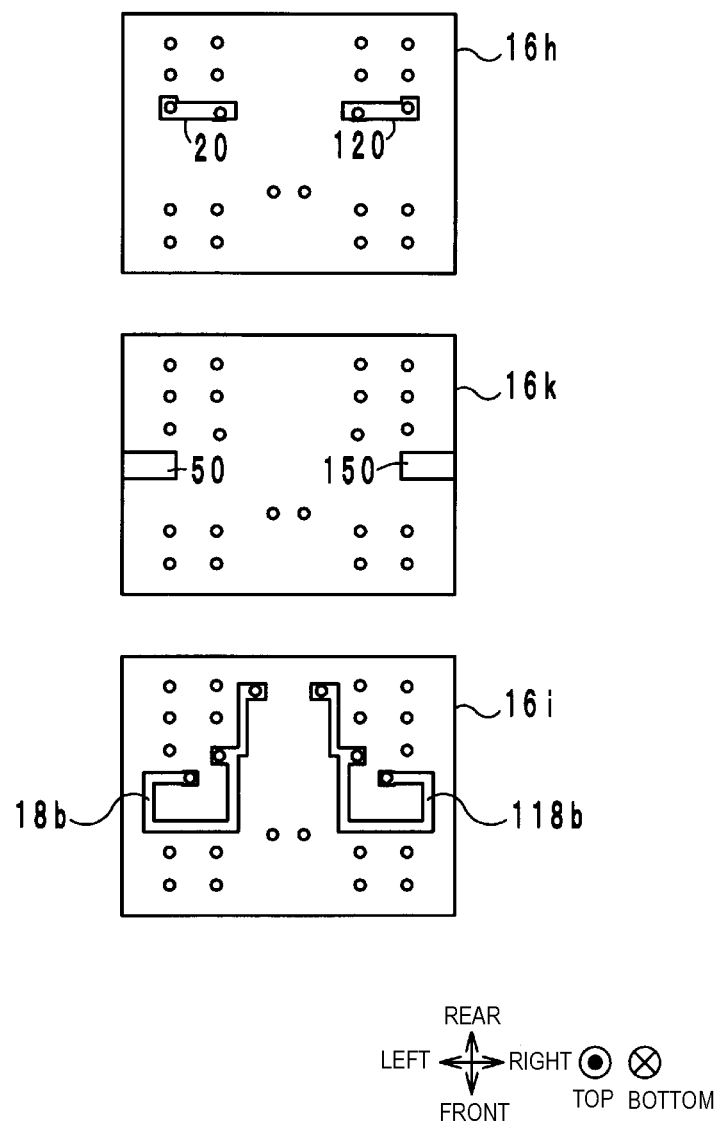
FIG. 9 shows plan views some insulating layers of an electronic component according to a third preferred embodiment of the present invention.

An electronic component 10c according to a third preferred embodiment of the present invention will be described below with reference to FIG. 9. FIG. 9 shows plan views of insulating layers 16h, 16k, and 16i of the electronic component 10c.

The electronic component 10c is different from the electronic component 10a in the position of the insulating layer 16k and the capacitor conductive layers 50 and 150. This will be discussed more specifically. The insulating layer 16k is disposed between the insulating layers 16h and 16i. The capacitor conductive layer 50 overlaps the inductor conductive layer 18b, as viewed from above. With this configuration, a capacitance is generated between the capacitor conductive layer 50 and the inductor conductive layer 18b. The structure of the capacitor conductive layer 150 is similar to that of the capacitor conductive layer 50, and an explanation thereof will thus be omitted.

The electronic component 10c configured as described above achieves the same advantages as those of the electronic component 10a.

Fourth Preferred Embodiment

Figure 10:
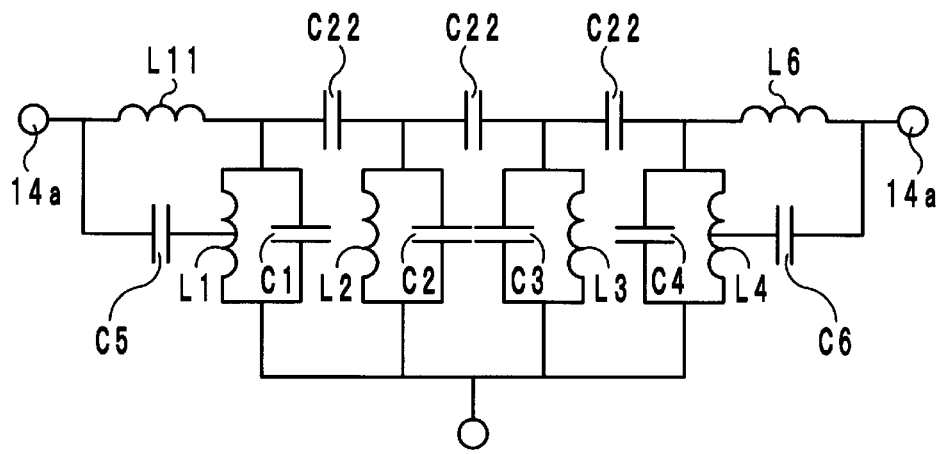
FIG. 10 is an equivalent circuit diagram of an electronic component according to a fourth preferred embodiment of the present invention.

An electronic component 10d according to a fourth preferred embodiment of the present invention will be described below with reference to the equivalent circuit diagram of FIG. 10.

The electronic component 10d is different from the electronic component 10a in that inductors L1 through L4 and capacitors C1 through C4 respectively define LC parallel resonators LC11 through LC14. The LC parallel resonators LC11 through LC14 define a band pass filter.

The electronic component 10d configured as described above achieves the same advantages as those of the electronic component 10a.

Fifth Preferred Embodiment

Figure 11:
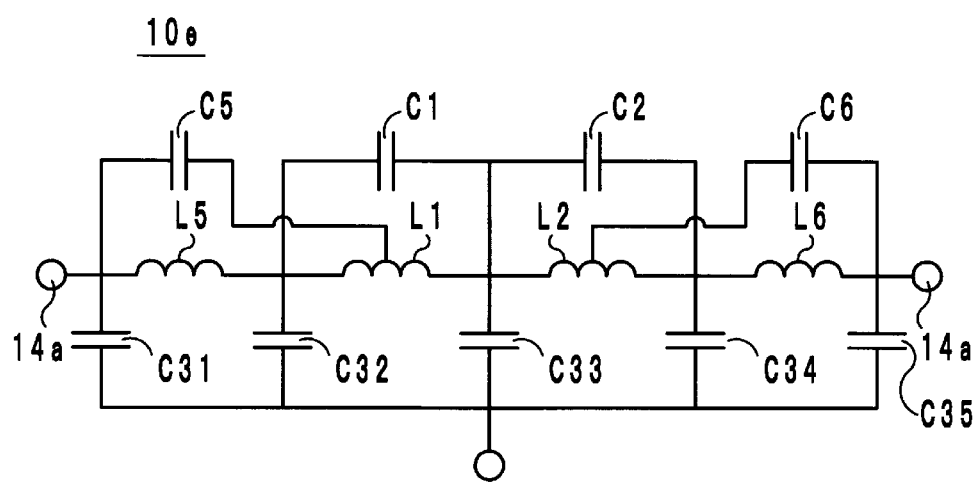
FIG. 11 is an equivalent circuit diagram of an electronic component according to a fifth preferred embodiment of the present invention.

An electronic component 10e according to a fifth preferred embodiment of the present invention will be described below with reference to the equivalent circuit diagram of FIG. 11.

The electronic component 10e is different from the electronic component 10a in that it is a low pass filter. More specifically, the capacitor C1 and the inductor L1 define an LC parallel resonator LC11, and the capacitor C2 and the inductor L2 define an LC parallel resonator LC12. The LC parallel resonators LC11 and LC12 are electrically connected in series with each other.

The inductor L5 is connected between the outer electrode 14a and the LC parallel resonator LC11. The inductor L6 is connected between the outer electrode 14b and the LC parallel resonator LC12.

The capacitor C5 defines an LC parallel resonator LC5, together with the inductor L5. The capacitor C6 defines an LC parallel resonator LC6, together with the inductor L6.

A capacitor C31 is connected between a node between the outer electrode 14a and the inductor L5 and the outer electrode 14c. A capacitor C32 is connected between a node between the inductors L5 and L1 and the outer electrode 14c. A capacitor C33 is connected between a node between the inductors L1 and L2 and the outer electrode 14c. A capacitor C34 is connected between a node between the inductors L2 and L6 and the outer electrode 14c. A capacitor C35 is connected between a node between the outer electrode 14b and the inductor L6 and the outer electrode 14c.

The electronic component 10e configured as described above achieves the same advantages as those of the electronic component 10a.

In the electronic component 10e, the resonant frequencies fa5 and fa6 of the LC parallel resonators LC5 and LC6 are preferably set so that they will coincide or substantially coincide with the cutoff frequency of the low pass filter.

Other Preferred Embodiments

An electronic component according to a preferred embodiment of the present invention is not restricted to the above-described electronic components 10a through 10e, and it may be modified within the spirit of the present invention.

The configurations of the electronic components 10a through 10e may be combined in a desired manner.

The capacitors C5 and C6 may be connected to ends of the inductors L1 and L4, respectively. By adjusting the positions at which the capacitors C5 and C6 are connected to the inductors L1 and L4, respectively, the inductance values of inductance components connected in parallel with the capacitors C5 and C6 are able to be adjusted.

The inductors L1 through L4 preferably have a helical or substantially helical shape in which they turn around by multiple turns. However, the inductors L1 through L4 may be configured to turn around by one turn or less.

The capacitor conductive layer 50 may not have to be directly connected to the outer electrode 14a, and may be electrically connected to the outer electrode 14a by using a via-hole conductor or another conductive layer.

Only one of the LC parallel resonators LC5 and LC6 may be provided.

Various preferred embodiments of the present invention are suitably used as an electronic component since it is possible to reduce the size of an electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body including a plurality of insulating layers stacked on each other in a stacking direction;
a first outer electrode disposed on a surface of the multilayer body;
first through n-th, where n is an integer of two or greater, resonators that are provided in the multilayer body in a first direction perpendicular or substantially perpendicular to the stacking direction in order of the first through n-th resonators, among the first through n-th resonators, resonators adjacent to each other in the first direction being magnetically coupled with each other; and
an additional LC parallel resonator connected to the first outer electrode; wherein
the first through n-th resonators respectively include first through n-th inductors and first through n-th capacitors;
the first through n-th inductors respectively include first through n-th inductor conductive layers disposed on an insulating layer of the plurality of insulating layers and first through n-th interlayer connecting conductors passing through an insulating layer of the plurality of insulating layers in the stacking direction, and the first through n-th inductor conductive layers and the first through n-th interlayer connecting conductors are connected to each other so that the first through n-th inductors are provided in a configuration in which the first through n-th inductors turn around, as viewed from the first direction;
the additional LC parallel resonator includes an (n+1)-th inductor and an (n+1)-th capacitor;
the (n+1)-th inductor includes a linear (n+1)-th inductor conductive layer which is provided in a configuration in which the linear (n+1)-th inductor conductive layer turns around, as viewed from the stacking direction, and which is located within a region surrounded by the first inductor, as viewed from the first direction, and the (n+1)-th inductor is directly conductively connected to the first resonator; and
the (n+1)-th capacitor is electrically connected to the first outer electrode, and includes an (n+1)-th capacitor conductive layer which opposes the first inductor conductive layer with an insulating layer of the plurality of insulating layers interposed therebetween.

2. The electronic component according to claim 1, wherein the first through n-th resonators are LC series resonators.

3. The electronic component according to claim 1, wherein the first through n-th resonators are LC parallel resonators.

4. The electronic component according to claim 1, wherein the (n+1)-th capacitor conductive layer opposes the (n+1)-th inductor conductive layer with an insulating layer of the plurality of insulating layers interposed therebetween.

5. The electronic component according to claim 1, wherein
the first inductor includes a plurality of the first inductor conductive layers; and
one of the plurality of first inductor conductive layers is disposed between the (n+1)-th capacitor conductive layer and the (n+1)-th inductor conductive layer in the stacking direction.

6. The electronic component according to claim 1, wherein
the first through n-th resonators define a band pass filter that allows a radio-frequency signal in a predetermined band to pass through the band pass filter; and
a resonant frequency of the additional LC parallel resonator coincides or substantially coincides with a cutoff frequency of a high frequency side of the predetermined band.

7. The electronic component according to claim 6, wherein the band pass filter includes a plurality of high pass filters and a plurality of low pass filters.

8. The electronic component according to claim 1, wherein the first through n-th interlayer connecting conductors are via-hole conductors.

9. The electronic component according to claim 1, wherein at least one of the first through n-th inductors has a helical or substantially helical shape.

10. The electronic component according to claim 1, wherein each of the first through n-th inductor conductive layers has a U-shape or substantially a U-shape opened rightward or leftward.

11. The electronic component according to claim 1, wherein the first through n-th capacitors include first through n-th capacitor conductor layers having an L-shaped or substantially L-shaped configuration, or a rectangular or substantially rectangular configuration.

12. The electronic component according to claim 1, wherein the first through n-th resonators define a low pass filter.

\* \* \* \* \*